Figure 1:
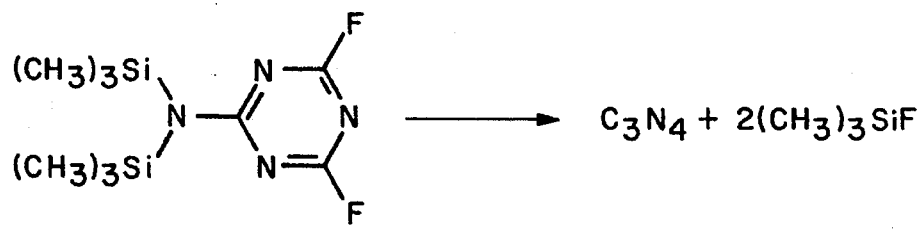

United States Patent [19]
Kouvetakis et al.

[11] Patent Number: 5,606,056
[45] Date of Patent: Feb. 25, 1997

[54] CARBON NITRIDE AND ITS SYNTHESIS

[75] Inventors: John Kouvetakis; Michael Todd, both of Tempe, Ariz.

[73] Assignee: Arizona Board of Regents, Tempe, Ariz.

[21] Appl. No.: 248,407

[22] Filed: May 24, 1994

[51] Int. Cl.$^6$ .............................. C07D 251/72; B32B 9/00
[52] U.S. Cl. ......................... 544/181; 428/408; 428/469; 428/698
[58] Field of Search .......................... 544/181; 428/408, 428/469, 698

[56] References Cited

U.S. PATENT DOCUMENTS

| | | | |
|---|---|---|---|
| 3,412,090 | 11/1968 | Knusil et al. | 544/181 |
| 4,003,764 | 1/1977 | Wünning | 148/16.5 |
| 4,033,764 | 7/1977 | Colegate et al. | 423/24 |
| 4,664,976 | 5/1987 | Kimura et al. | 428/336 |
| 5,110,679 | 5/1992 | Haller et al. | 428/408 |

FOREIGN PATENT DOCUMENTS

| | | | |
|---|---|---|---|
| 638065 | 3/1962 | Canada | 260/249.6 |

OTHER PUBLICATIONS

"Carbon–Nitrogen Pyrolzates: Attempted Preparation of Carbon Nitride" by Maya, et al. *J. Am. Ceram. Soc.* vol. 74(7), pp. 1686–1688 (1991).

Roesky et al. Chemical Abstract, vol. 85 #192830, 1976.

*Primary Examiner*—Yogendra N. Gupta
*Attorney, Agent, or Firm*—David G. Rosenbaum

[57] ABSTRACT

An extended solid bulk composition carbon nitride ($C_3N_4$) having an atomic ratio of carbon to nitrogen in the range of 3:4 to 3.2:4 as a bulk solid, produced by thermal decomposition and chemical vapor deposition of precursors having formula (I):

$$C_3N_3XX'N(MR_3)(M'R'_3) \quad (I)$$

wherein C3N3 is a cyclic 1,3,5-triazine group, X is a halogen selected from the group consisting of fluorine, chlorine, bromine, and iodine, X' is a halogen selected from the group consisting of fluorine, chlorine, bromine, and iodine, M is a group IV metal, M' is a group IV metal, R is an alkyl substituent, and R' is an alkyl substituent, producing a decomposition gas decomposition gas having formula II:

$$XMR_3 \quad (II)$$

4 Claims, 4 Drawing Sheets

CARBON NITRIDE AND ITS SYNTHESIS

BACKGROUND OF THE INVENTION

The present invention relates to an extended solid bulk composition carbon nitride ($C_3N_4$) and its synthetic method. More particularly, the present invention relates to a starting material for the synthesis of $C_3N_4$, a synthetic method for manufacture of $C_3N_4$, and a novel bulk composition material $C_3N_4$ with at least partial hybridization of $sp_2$.

The $\beta$-$C_3N_4$ form has a diamond like structure with $sp^3$ hybridization. The $\alpha$-$C_3N_4$ also has the diamond like structure with the difference being that one crystallographic axis is doubled. These forms are extended solids that have the potential to be among the hardest known substances synthesized. This hardness coupled with a low mass density would yield extremely hard and light materials. Cubic carbon nitride would also provide excellent wear resistance and corrosion resistance to substrate materials.

Tremendous efforts have been made to synthesize cubic $C_3N_4$ or ($\alpha$-$C_3N_4$ and $\beta$-$C_3N_4$). These previous attempts have included high-pressure thermal decomposition of C-H-N precursors, ion and vapor deposition of nitrogen ions and carbon vapor, plasma decomposition of methane and nitrogen, shock-wave compression of organic molecules and supporting experiments. Hard carbon-nitrogen materials containing 60% C and 40% N have been deposited by pulsed laser ablation of graphite in combination with an atomic nitrogen source. However, each of these methods have resulted in materials with bulk nitrogen contents much lower than the expected 57 at. % for $C_3N_4$. These previous attempts at synthesizing cubic carbon nitride have resulted in either amorphous films with very low nitrogen content or purported findings of extremely small crystallites of the cubic carbon nitrides resident in an amorphous carbon matrix. The purported finding of small crystallites in amorphous carbon matrix are unsuitable for any useful exploitation of the unique properties of a bulk composition $C_3N_4$.

U.S. Pat. No. 4,033,764 issued to Wunning on Jan. 18, 1977 discloses a method for the preparation of a surface layer of $\epsilon$-carbon nitride on ferrous metal parts. The Wunning patent discloses that heating dissociated ammonia with a small amount of carbon monoxide and carbon dioxide in the presence of ferrous metal parts allows the condensation of a thin film of e-carbon nitride on the ferrous metal parts. The exact composition of the carbon nitride in this patent is unreported, but is expected by one versed in the art to have low nitrogen content. This is because the source of nitrogen is ammonia, and it is quite likely that much of the nitrogen in the surface layer of carbon nitride remains at least partially protonated.

U.S. Pat. No. 4,664,976 issued to Kimura et al. on May 12, 1987 reveals a method for the preparation of a thin film of carbon nitride. The Kimura et al. patent discloses that a thin film of carbon nitride with carbon:nitrogen atomic ratio of 4:1 to 3:2 is formed by use of a sputtering device in which a RF power is applied to a carbon target in an atmosphere of nitrogen gas while heating the substrate between 50° C. to 250° C. This nitrogen content is also considerably low compared to the ideal C:N ratio of 3:4.

Maya, et al., "Carbon-Nitrogen Pyrolyzates: Attempted Preparations of Carbon Nitride", *J. Am. Ceram. Soc.*, 74(7), 1686 (1991) reveals the thermal decomposition of organic compounds containing relatively high nitrogen contents. These thermal decompositions occur at temperatures in excess of 700° C. in a high pressure bomb, and resulted in the formation of powders with atomic ratio of 3:2. X-ray Photo spectroscopy indicates that the hybridization of the thin films is $sp^2$. This too is severely deficient in nitrogen content. The ordinary person skilled in the art will recognize that this powder is a form of graphite with high nitrogen impurities.

U.S. Pat. No. 5,110,679 issued on May 5, 1992 to Haller et al. reveals a sputtering method for the formation of carbon nitride thin films in a nitrogen atmosphere onto a heated substrate. The Haller et al. patent discloses that sputtering of carbon in a nitrogen atmosphere onto a heated substrate results in the formation of a carbon nitride thin film with nominal atomic composition of 3:2. The Haller patent is the first to disclose purported $C_3N_4$ crystallites in an amorphous carbon matrix. X ray diffraction of the amorphous carbon matrix suggests that the entire matrix may have the $sp^3$ hybridization characteristic of $\beta$-$C_3N_4$.

Niu, et al. "Experimental Realization of Covalent Solid Carbon Nitride", *Science*, 334, 261 (1993), discusses a method for preparing carbon nitride thin films by pulsed laser ablation of a graphite target combined with a high-flux atomic nitrogen source. This thin film has an average carbon to nitrogen ratio of 3:2. This paper also reports the formation of crystallites of $\beta$-$C_3N_4$ with its characteristic $sp^3$ hybridization.

Chubaci, et al., "Properties of Carbon Nitride Thin Films Prepared by Ion and Vapor Deposition", Nucl. Instrum. Methods Phys. Res., B80, 463 (1993) discusses nitrogen ion bombardment and carbon vapor deposition on substrates to form carbon nitride. These films also have very low nitrogen content with atomic ratios varying from 5:1 to 14:1.

Li et al., "Nano-Indention Studies of Ultrahigh Strength Carbon Nitride Thin Films", *J. Appl. Phys.*, 74(1), 219 (1993) discusses the formation of carbon nitride by d.c. magnetron sputtering of a graphite target in a nitrogen ambient atmosphere onto a substrate. These thin films have low nitrogen content but include crystallites of $\beta$-$C_3N_4$ with its characteristic $sp^3$ hybridization.

Each of these methods for the formation of the cubic carbon nitride either yield carbon matrices which have been characterized as having small discontinuous crystallites with X-ray diffraction patterns consistent with carbon nitride. However, none of these prior methods have demonstrated any ability to synthesize bulk modulus extended solids of carbon nitrides with a C:N atomic ratio of 3:4.

Accordingly, the inventors hereof have recognized a need to provide suitable precursors having stoichiometry consistent with the final stoichiometry of the extended bulk modulus carbon nitride. The term extended bulk modulus is intended to mean a stable solid $C_3N_4$ having at least one dimension equal to about 30–40Å. The precursors provide the compositional and structural framework in which each amino-1,3,5-triazine unit in the bulk composition is about 3–4Å. Thus, in accordance with the present invention, an extended bulk modulus of carbon nitride consists of about ten bound triazine units in any one dimension. In order to form a stable solid, it is believed that repeating units of four triazine rings are required.

Additionally, a need has been recognized to develop a synthetic method employing the precursors for the synthesis of cubic carbon nitride. By selecting the starting material to have a stoichiometry comparable to a polymerization unit for the extended bulk carbon nitride, the synthesis of the extended bulk carbon nitride can be conducted under thermal decomposition conditions wherein the carbon nitride is the yielded end product with gaseous byproducts.

There is also a great need for a precursor and a synthetic method with which said starting material for cubic carbon nitride may be manufactured.

SUMMARY OF THE INVENTION

Accordingly, it is a broad object of the present invention to provide a suitable starting material for the formation of cubic carbon nitrides.

A further object of the present invention is to provide precursors and methods for the preparation of the starting material for cubic carbon nitrides.

It is a still further object of the present invention to provide precursors having preselected stoichiometry consistent with the structure of the extended bulk solid carbon nitride end product.

The present invention provides novel precursors and a novel synthetic method for the manufacture of a new, at least partially sp² hybridized, carbon nitride. The precursor is selected to function similar to a polymerization unit such that under conditions sufficient for thermal decomposition of the precursor, the polymerization units bond and evolve a gaseous species leaving the bulk extended solid $C_3N_4$.

DETAILED DESCRIPTION OF THE PREFERRED EMBODIMENTS AND BRIEF DESCRIPTION OF THE DRAWINGS

Figure 2:
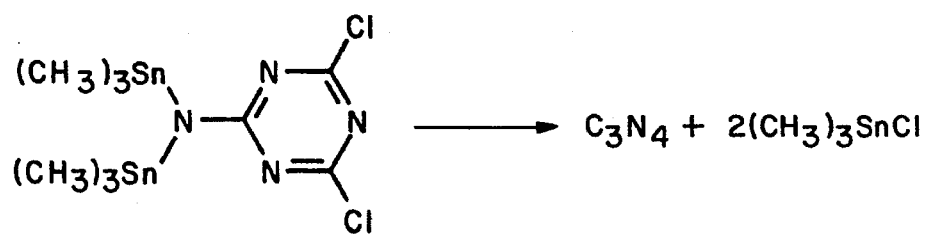

The foregoing objectives and others further disclosed herein are provided by the invention wherein a precursor 2,4-dihalo-6-bis (trialkyl(group IV))amine-1,3,5-triazine having the general formula I as follows:

$$C_3N_3XX'N(MR_3)(M'R'_3) \qquad (I)$$

wherein $C_3N_3$ is a cyclic 1,3,5-triazine group, X is a halogen selected from the group consisting of fluorine, chlorine, bromine, and iodine, X' is a halogen selected from the group consisting of fluorine, chlorine, bromine, and iodine, M is a group IV metal, M' is a group IV metal, R is an alkyl substituent, and R' is an alkyl substituent. The triazine of formula I is thermally decomposed in a CVD apparatus to produce substantially sp² hybridized carbon nitride having the general formula: $C_3N_4$. This reaction is illustrated in FIG. 1 which illustrates the thermal decomposition reaction of 2,4-difluoro-6-bis-(trimethylsilyl)amine-1,3,5-triazine. FIG. 2 which illustrates a thermal decomposition reaction of 2,4-dichloro-6-bis(triethyltin)amine-1,3,5-triazine to yield $C_3N_4$ via elimination of fluoro-trimethylsilane and chloro-triethyltin as gaseous species.

Figure 3:
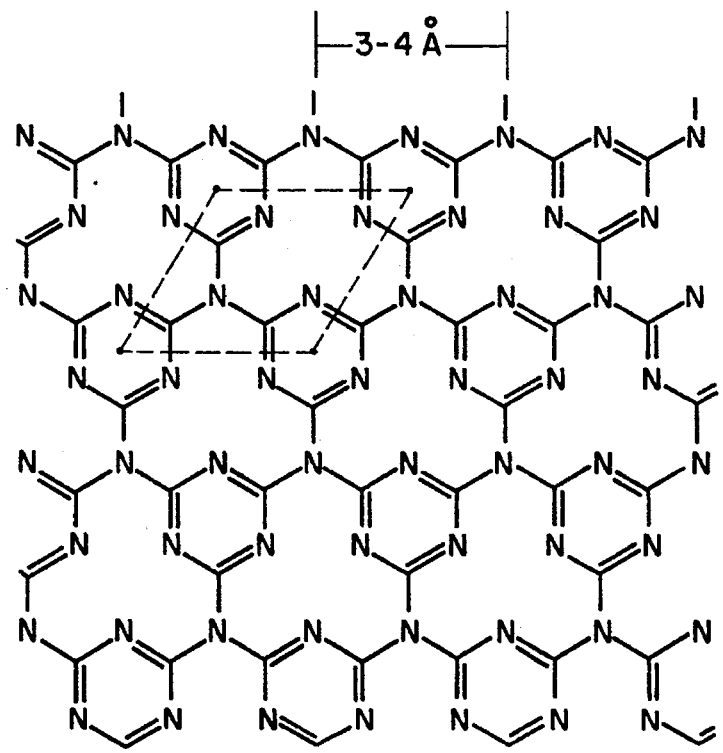

Crystalline $C_3N_4$ in which both the carbon atoms and the nitrogen atoms are 3-fold coordinated and form dense layers like the carbon atoms in graphite is not possible for symmetry layers. Thus, the layered structure illustrated in FIG. 3 is believed to represent the present carbon nitride bulk material in which the (CN)₃N framework of the 2,4-dihalo-6-bis-(trialkyl(Group IV Metal))amine-1,3,5-triazine is both the compositional and structural building block. The precursors provide the compositional and structural framework in which each amino-1,3,5-triazine unit is about 3–4Å. Thus, in accordance with the present invention, an extended bulk material of carbon nitride consists of about ten bound triazine units in any one dimension. In order to form a stable solid, it is believed that repeating units of four triazine rings, depicted by dashed line A in FIG. 3, are required. The structure of a single layer as illustrated in FIG. 3 is not as dense as graphite, but contains periodic holes. While a single layer is depicted, those skilled in the art will understand and appreciate that numerous layers may formed in the z-axis. Each layer has two types of nitrogen atoms: two-thirds are two-fold coordinated and one-third is three-fold coordinated.

Thus, the preferred method for making the carbon nitride target materials is to mimic the desired stoichiometry of the target material in a conveniently prepared precursor which decomposes at relatively low temperatures. The inventive method involves chemical vapor deposition of sp² carbon nitrides with an average composition corresponding to nearly stoichiometric $C_3N_4$. The thin films made by the inventive method have carbon contents ranging from 43–45% and nitrogen contents ranging from 55–57%, which are the highest observed in C-N solids. The synthetic route to these materials involves deposition temperatures of 300°–500° C. and the use of inorganic, unimolecular precursors which incorporate the correct stoichiometry to yield the end product stoichiometry. In order to maintain lower deposition temperatures, the precursors do not contain any strong CH and NH bonds in the portion of the precursor molecule which is to remain as the extended solid carbon nitride. Alternatively, the portion of the precursor molecule which is to leave, i.e., the leaving group, it is desirable to have relatively stronger CH bonds.

The precursor molecule preferred in for use in the inventive method is a tri-substituted 1,3,5-triazine in which two of the substituents are halides and the third substituent is an amide. The two substituent halides can both be the same halide or different halides. The two substituent halides are selected from the group of halides consisting of fluorine, chlorine, bromine, and iodine. The amide can have a set of two organometallic substituents that are bisubstituted group IV metals. The two metal atoms in the two organometallic substituents can both be the same group IV metal or different group IV metals. The metal atoms in the two organometallic substituents are selected from the group of metals consisting of silicon, tin, and germanium. The two organic substituents on the organometallic substituents can be an alkyl substituent. These organic substituents can both be the same alkyl substituent or different alkyl substituents. These organic substituents have from 1 to 3 carbon atoms and are preferably selected from the group consisting of methyl, ethyl, propyl, and isopropyl. The precursors are generally inert and, therefore, are substantially environmentally friendly.

In accordance with the preferred embodiments of the present invention and the best mode known to practice the invention, particularly useful 2,4-dihalo-6-bis(trialkyl(group IV))amine-1,3,5-triazines include:

2,4-difluoro-6-bis(trimethyltin)amine-1,3,5-triazine; 2,4-difluoro-6-bis(trimethylsilyl)amine-1,3,5-triazine; 2,4-dichloro-6-bis(trimethyltin)amine-1,3,5-triazine; or 2,4-dichloro-6-bis(trimethylsilyl)amine-1,3,5-triazine.

However those skilled in the art will recognize and appreciate that other Group IV metals, such as germanium, or other halogens such as bromine or iodine, may be also exhibit utility as precursors. However, where the brominated or the iodinated triazine compound is employed, it is likely that the relatively carbon-nitrogen bonds in the aromatic triazine ring structure would be destabilized and disassociate into the halocyanide compounds. This result would likely occur due to the relatively lower electronegativity of bromine and iodine compared to fluorine or chlorine, which appear to better stabilize the carbon-nitrogen bonds in the triazine ring. Only routine experimentation would be required by one skilled in the art to ascertain whether the bromine or iodine 2,4-substituted triazine would behave in the foregoing manner or would exhibit utility in the method of the present invention.

The invention further provides a method for making at least partially $sp^2$ hybridized carbon nitride by heating the precursors. This method consists of chemical vapor deposition of the precursors upon a suitable substrate and heating to between about 300°–500° C. The heating of the precursor effects a thermal decomposition wherein the halide substituents and organometallic substituents evolve as a gas. The resulting residue can be characterized as a carbon nitride. The evolved gas can be characterized by the general formula II as follows:

$$XMR_3 \qquad (II)$$

in which X is a halogen selected from the group consisting of fluorine, chlorine, bromine, and iodine, M is a Group IV metal, and R is an alkyl substituent.

The present invention thus provides a novel partially $sp^2$ hybridized carbon nitride having a carbon to nitrogen atomic ratio of about 3:4. The inventive carbon nitride has been deposited as thin films. These thin films are shiny with a mirror-like quality characteristic of all thin films. Electron Energy Loss Spectroscopy (EELS) done on free standing samples placed upon carbon coated copper grid indicates that there are substantially no impurities present in the sample. The K-edge fine structure indicates that there is appreciable $sp^2$ hybridization of both the carbon and the nitrogen.

While crystalline ($sp^3$ hybridized) carbon nitrides, and amorphous ($sp^3$ and $sp^2$ hybridized) thin films are known, at least partially $sp^2$ hybridized carbon nitrides with atomic carbon to nitrogen ratio of about 3:4 have not heretofore been synthesized or otherwise known in the art.

The present invention demonstrates that the thermal decomposition of 2,4-dihalo-6-bis(trialkyl(group IV))amine-1,3,5-triazines forms thin films of essentially pure carbon nitride with substantial $sp^2$ hybridization. This form of carbon nitride is predicted to be the best starting material for the formation of bulk quantities of cubic forms of carbon nitride. These films also have exceptional characteristics of their own, such as optical, dielectric, and material strength.

The invention is further illustrated, by, but not limited to, the following examples:

EXAMPLE I 2,4,6-trifluoro-1,3,5-triazine was reacted with lithium bis(trimethylsilyl)amide to produce 2,4-difluoro-6-bis (trimethylsilyl)amine-1,3,5-triazine in 40% yield. The resulting compound was colorless, air-stable and a fairly volatile liquid (bp 65 C at 2 Torr). The $^{13}C$ spectrum in deuteriochloroform showed the expected resonances corresponding to the ring carbons and the methyl carbons of the trimethylsilyl groups. The FTIR spectrum revealed the characteristic C-H stretches of the trimethylsilyl group at 2966–2905 $cm^{-1}$ and the strong absorptions of the aromatic ring at 1500–1632 $cm^{-1}$. Mass spectroscopic analysis indicated the molecular ion minus $CH_3$ as the most intense peak at m/e=261 and a fragmentation pattern which was consistent with the monosubstituted ring patten.

2,4-difluoro-6-bis (trimethylsilyl)amine-1,3,5-triazine was decomposed in a low-pressure chemical vapor deposition reactor at temperatures as low as 350° C. to yield thin films. It was observed that temperatures between 450° C. and 500° C. were preferable due to the low growth rates at temperatures below 450 ° C. Typical run times were 1–2 hours resulting in films 1200–4000Å thick.

Figure 4:
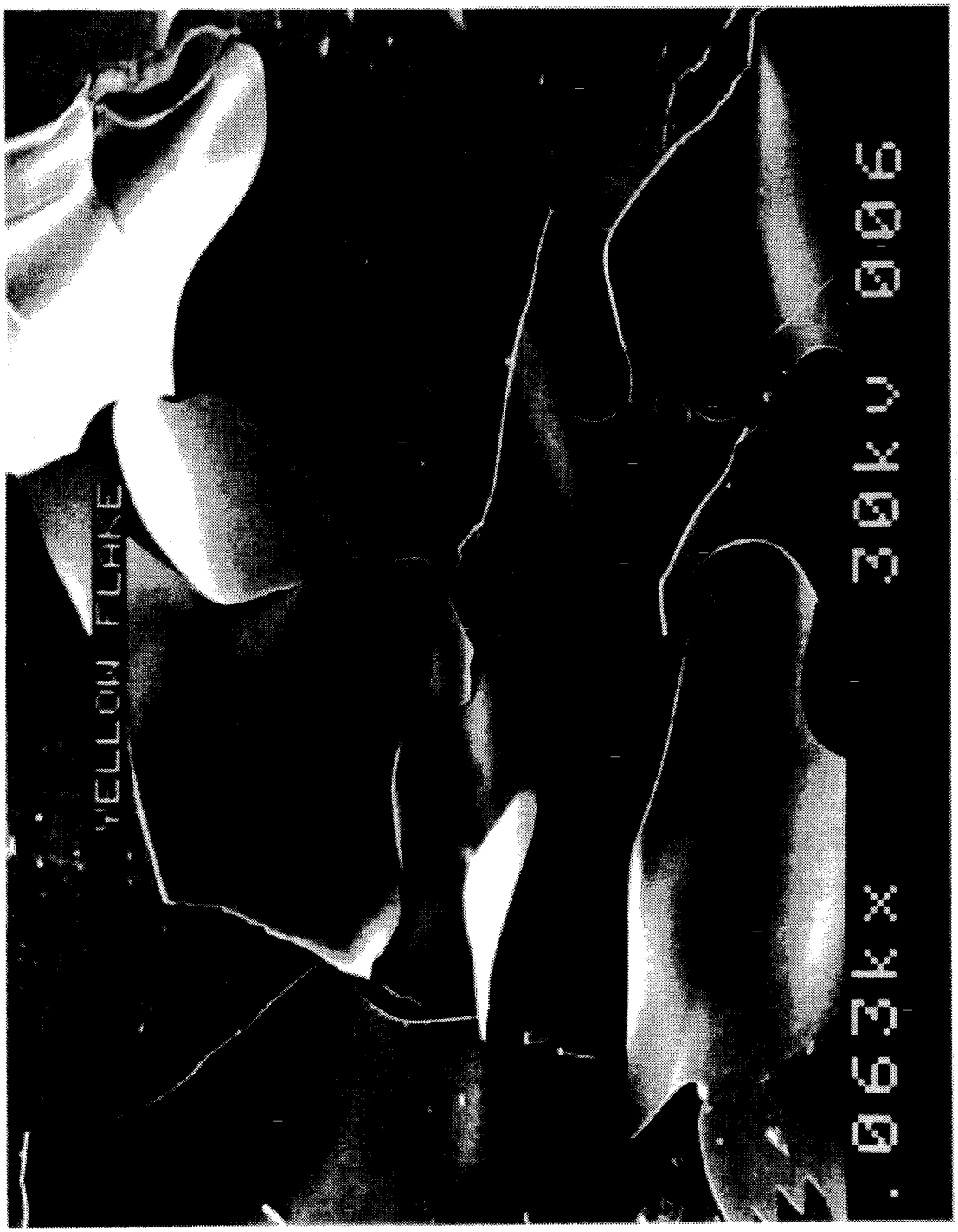

All films adhered well to silicon, $SiO_2$, HOPG (highly oriented pyrolyric graphite) and beryllium substrates and were smooth and continuous when examined with optical and scanning electron microscopes. The films exhibited mirror-like appearance and bright coloration which resembled those of aluminum nitride, gallium nitride and boron nitride thin films. FIG. 4 is a scanning electron micrograph showing thin films of 2,4-difluoro-6-bis(trimethylsilyl)amine-1,3,5-triazine flakes which have been scrapped from the substrate for scanning electron microscopy. The micrographs were taken at 630X magnification at 30 keV.

The decomposition byproduct of the deposition of 2,4-difluoro-6-bis(trimethylsilyl)amine-1,3,5-triazine, i.e., fluorotrimethylsilane, was collected in a liquid nitrogen trap and examined by NMR, FTIR and vapor pressure measurements as described by Light, Von K, et al, Z. Anorg. Allg. Chem. 1975, 415, 31–42. The main component of the byproduct mixture was identified as fluoro trimethyl silane and the remainder of the precursor starting material. The total mass of the mixture corresponded approximately to the weight loss of the precursor indicating no substantial loss due to noncondensibles.

EXAMPLE II

The identical procedures were followed as in Example I, except that 2,4,6-trichloro-1,3,5-triazine was reacted with lithium bis(trimethylsilyl)amide in the same CVD reactor set up at temperatures of 400°–450° C. and nitrogen pressures of 0.1 to 0.5 Torr to yield 2,4-dichloro-6-bis(trimethylsilyl) amine-1,3,5-triazine. Film growth rates and appearance were similar to those observed in Example I. The byproducts of the decomposition reaction consisted almost exclusively of chlorotrimethyl silane and traces of an unidentified volatile solid. No starting material was collected in the liquid nitrogen trap.

Figure 5:
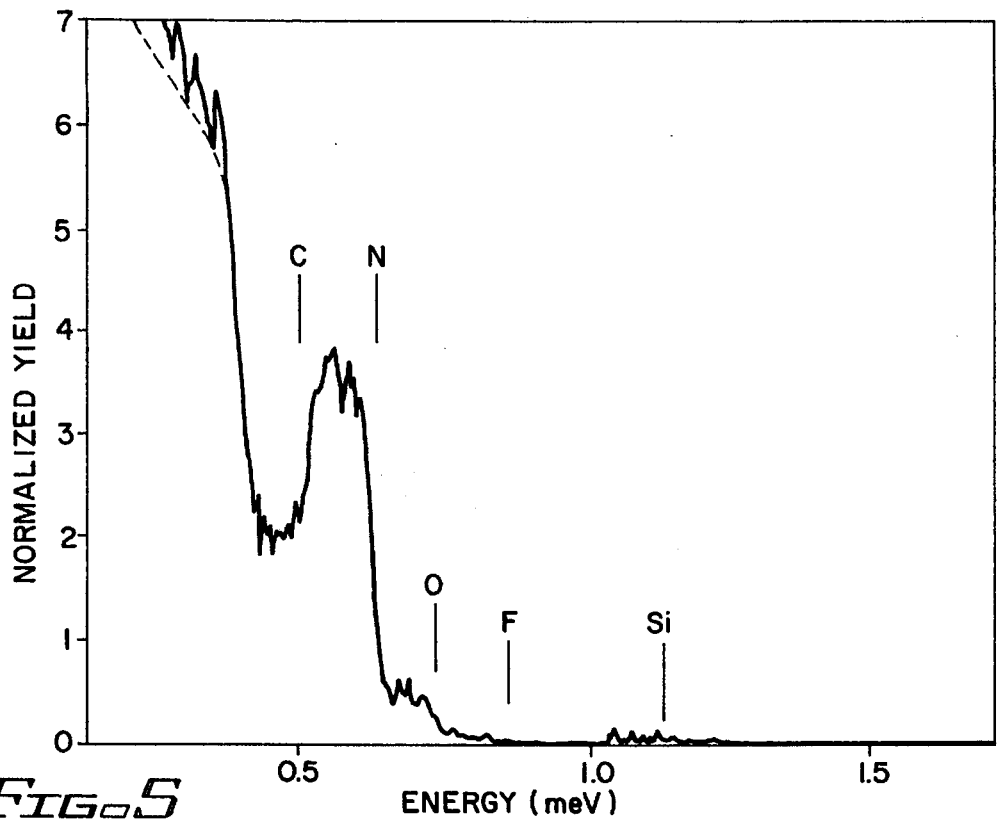
Figure 6:
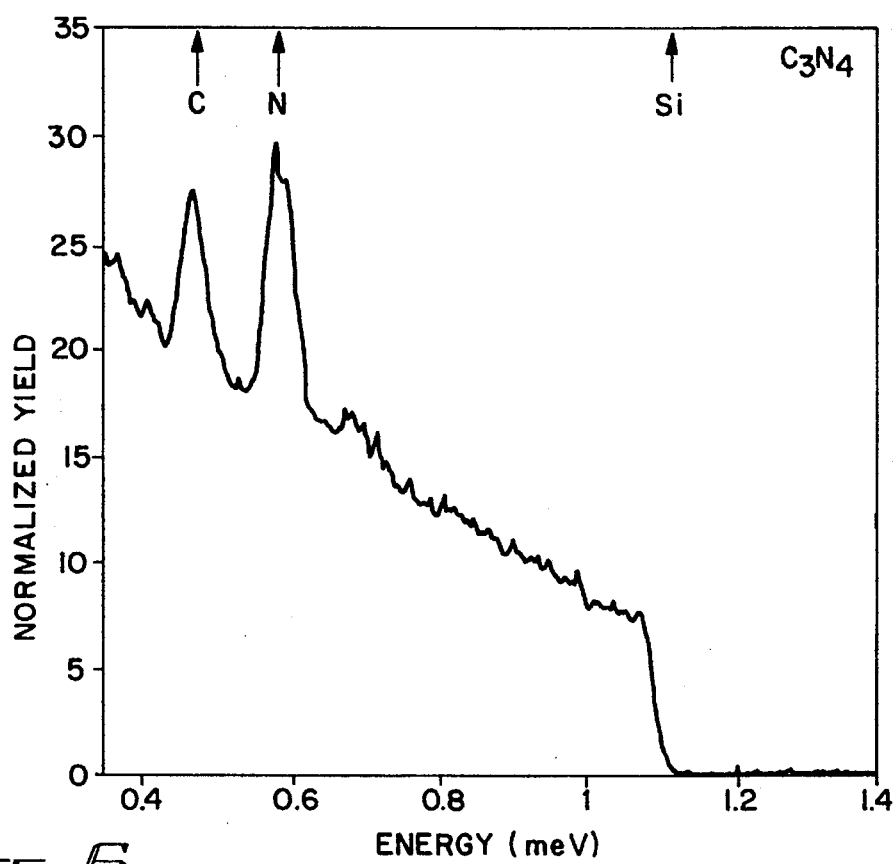

The carbon-nitrogen ratios of the films obtained in Examples I and II were established by Rutherford backscattering (RBS) analysis. In addition to the carbon and nitrogen analysis, the experiments included channeling through the silicon substrate to enhance the C and N signals, oxygen resonance reactions and He forward scattering to determine levels of oxygen and hydrogen impurities. RBS was also used to estimate film thicknesses. FIG. 5 illustrates a 2-Me V aligned spectrum for the 1200 Å film in Example I deposited on (100) silicon. The film contains only carbon and nitrogen in a 3:4 ratio with an oxygen impurity on the order of 2–3 at. % as represented by the oxygen resonance. Thin films were also deposited on graphite and beryllium metal to avoid the silicon background. Rutherford backscattering spectra of the deposited films and energy-dispersive X-ray analysis (EDX) of free-standing films confirmed only trace amounts of silicon and fluorine. FIG. 6 illustrates the RBS spectrum of a 3000 Å thin-film sample obtained in Example I on graphite with composition $C_3N_4O_{0.3}Si_{0.02}F_{0.05}$. The presence of silicon or fluorine is, however, the exception. In most depositions, Si and F were not observed, even in trace quantities. Similarly, RBS and EDX analysis of films on silicon, graphite and beryllium metal in accordance with Example II also indicated $C_3N_4$ compositions with noise levels of silicon and chlorine.

Figure 7:
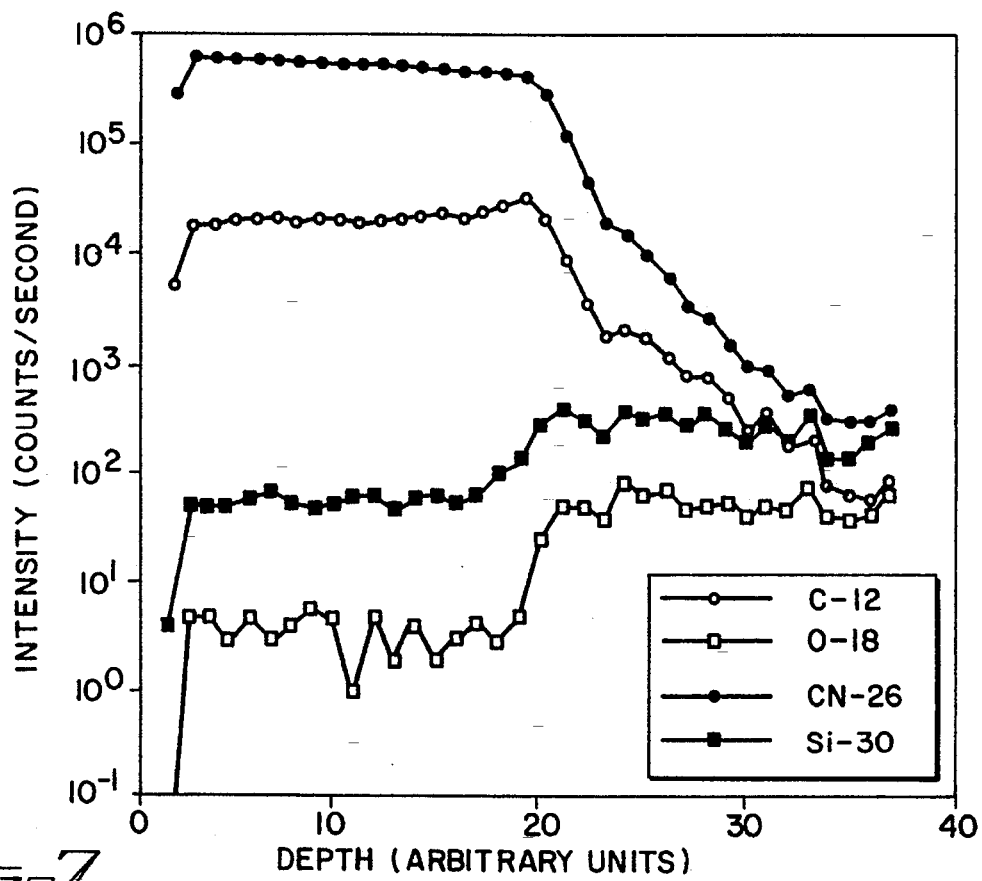

Secondary ion mass spectroscopy (SIMS) depth profile experiments on films obtained under Examples I and II demonstrated that carbon and nitrogen are largely homogenous throughout the films, the absence of hydrogen and silicon and that oxygen impurities were restricted to the film surfaces. A representative SIMS profile of an inventive carbon nitride film is depicted in FIG. 7. FIG. 7 is a SIMS profile of an inventive carbon-nitrogen film in which $^{12}$C-, $^{18}$O-, $^{30}$Si- and $^{26}$CN- were monitored. Nitrogen cannot be monitored under SIMS because it does not provide a stable elemental negative ion.

Finally, film morphologies and bonding characteristics of the films obtained in Examples I and II were studied by X-ray diffraction, scanning electron microscopy, transmission infrared spectroscopy, carbon-13 nuclear magnetic resonance spectroscopy and electron energy loss spectroscopy (EELS). X-ray diffraction indicated that the resulting film was amorphous as represented by a broad reflection at d=3.6 Å. This reflection is reminiscent of amorphous carbon diffraction patterns. Scanning electron microscopy on an II 440 SAM operated at 30 k V revealed that the films were smooth and featureless as depicted in FIG. 4.

Figure 8:
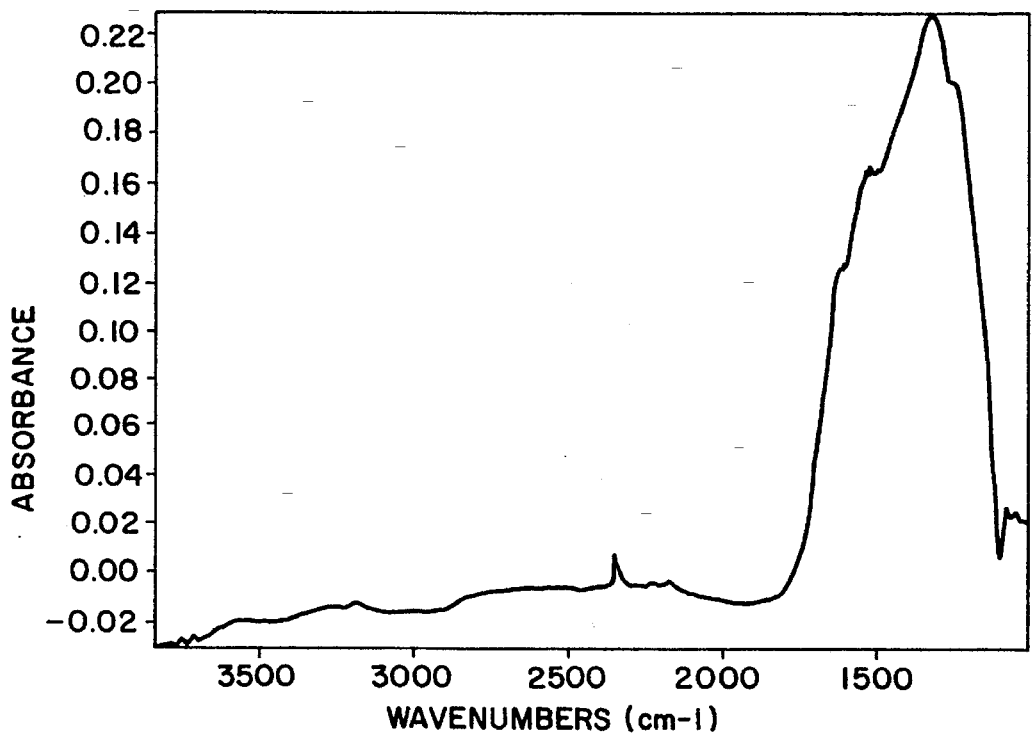

Transmission infrared spectroscopy was conducted on films deposited in accordance with Examples I and II on single crystal silicon wedges. The films were polished slightly off axis to suppress interference effects. FIG. 8 shows the spectrum of a film taken 24 hours after deposition at 450° C. The strong bands between 1650 and 1150 cm$^{-1}$ represents the (CN)$_3$ and C-N stretching modes. The small peak at 2300 cm$^{-1}$ corresponds to the presence of a triple bonded C-N stretch and the broad peak at 3200 cm$^{-1}$ corresponds to O-H contamination. The oxygen due to the O-H was also observed by RBS resonance and SIMS depth profile experiments primarily as surface contamination.

Carbon-13 NMR spectra of free-standing films showed a strong, sharp resonance at 104 ppm and a weak, broad shoulder at 115 ppm indicating sp2 hybridized carbon. There is no evidence of the presence of sp3 hybridized carbon. EELS of the same films, FIG. 9, supported on a carbon coated grid clearly demonstrated that the material contains only carbon and nitrogen. The nitrogen K-edge fine structure contains a broad $\pi$ to $\pi$* transition indicative of a strong sp$^2$ character. EELS could not be used to differentiate between the sp$^2$ nitrogen and any sp$^3$ nitrogen which may be present in the C$_3$N$_4$ because the $\pi$ to $\pi$* transition masks any sp$^3$ hybridization present.

EXAMPLE III

The identical procedures of Example I are followed, except that 2,4,6-trichloro-1,3,5-triazine is reacted with lithium bis(trimethyltin)amide to produce 2,4-dichloro-6-bis (trimethyltin)amine-1,3,5-triazine. 2,4-dichloro-6-bis (trimethyltin)amine-1,3,5-triazine is decomposed in a low-pressure CVD reactor at temperatures as low as 350° C. to yield thin films. Typical run times were 1–2 hours resulting in films 1200–1400Å thick.

EXAMPLE IV

The procedures of Example I are followed, except that 2,4,6-trichloro-1,3,5-triazine is reacted with lithium bis(trimethylsilyl)amide to yield 2,4-dichloro-6-bis (trimethylsilyl)amine-1,3,5-triazine. 2,4-dichloro-6-bis (trimethylsilyl)amine-1,3,5-triazine is decomposed in a low-pressure CVD reactor at temperatures as low as 350° C. to yield thin films. Typical run times were 1–2 hours resulting in films 1200–1400Å thick.

The carbon nitride film stoichiometries obtained by the above-described method range from C$_3$N$_4$ to C$_{3.2}$N$_4$, the highest nitrogen contents ever observed in C-N bulk modulus solids. While the preferred embodiments have been described above, it will also be apparent to those of ordinary skill in the art that various modifications may be made to the above teachings and from practice of the invention. Such changes include varying the temperature, chamber pressure, and substrate composition. Where the preferred embodiments have been described above, it will also be apparent to those of ordinary skill in the art that various modifications may be made to the above teachings and from practice of the invention. Such changes include varying the temperature, chamber pressure, and substrate composition.

What is claimed is:

1. A compound consisting of carbon nitride having an atomic ratio of carbon to nitrogen in the range of 3:4 to 3.2:4 as a bulk solid.

2. A compound consisting of carbon nitride having an atomic ration of carbon to nitrogen in the range of 3:4 to 3.2:4 as a bulk solid, produced by the process comprising the steps of:

(a) depositing onto substrate a 2,4-dihalo-6bis(trialkyl-(group IV)) amine-1,3,5-triazine compound, comprising the general formula (I):

$$C3N3XX'N(MR3)(M'R'3) \qquad (I)$$

wherein C3N3 is a cyclic 1,3,5-triazine group, X is a halogen selected from the group consisting of fluorine, chlorine, bromine, and iodine, X' is a halogen selected from the group consisting of fluorine, chlorine, bromine, and iodine, M is a group IV metal, M' is a group IV metal, R is an alkyl substituent, and R' is an alkyl substituent; and (b) heating said compound thereby evolving a decomposition gas, said decomposition gas comprising the general formula II:

$$XMR_3 \qquad (II)$$

wherein X is a halogen selected from the group consisting of fluorine, chlorine, bromine and iodine, M is a group IV metal and R is an alkyl substituent.

3. The carbon nitride product produced by the process of claim 2, further limited in that M and M' are Group IV metals selected from the group consisting of silicon, tin and germanium.

4. The carbon nitride product produced by the process of claim 2, further limited in that R and R' are alkyl substituents selected from the group consisting of branched or straight chain alkyl groups having 1 to 4 carbon atoms.

* * * * *